United States Patent [19]

Oransky et al.

[11] 4,245,003

[45] Jan. 13, 1981

[54] COATED TRANSPARENT FILM FOR LASER IMAGING

[75] Inventors: Raymond L. Oransky, Portland; David G. Savage, W. Buxton, both of Me.

[73] Assignee: James River Graphics, Inc., South Hadley, Mass.

[21] Appl. No.: 67,385

[22] Filed: Aug. 17, 1979

Related U.S. Application Data

[63] Continuation of Ser. No. 869,913, Jan. 16, 1978, abandoned.

[51] Int. Cl.³ .................... B32B 5/16; B23K 9/00; B05D 3/06
[52] U.S. Cl. .................... 428/323; 101/401.1; 101/467; 346/76 L; 427/53.1; 427/146; 427/372.2; 427/374.1; 428/408; 428/480; 428/523; 428/913; 430/300; 430/302

[58] Field of Search ............... 428/323, 408, 523, 913, 428/480; 427/53, 146, 372 R, 374 R; 346/76 L; 101/467, 401.1; 96/27 R; 430/300, 302

[56] References Cited

U.S. PATENT DOCUMENTS

| | | | |
|---|---|---|---|
| 3,570,380 | 3/1971 | Kamenstein | 346/76 L |
| 3,650,796 | 3/1972 | Jackson | 346/76 L |
| 3,739,088 | 6/1973 | Landsman | 346/76 L |
| 3,742,853 | 7/1973 | Landsman | 346/76 L |
| 3,945,318 | 3/1976 | Landsman | 346/76 L |
| 3,962,513 | 6/1976 | Eames | 346/76 L |
| 3,964,389 | 6/1976 | Peterson | 346/76 L |
| 3,999,918 | 12/1976 | Landsman | 346/76 L |

*Primary Examiner*—Ellis P. Robinson
*Attorney, Agent, or Firm*—Chapin, Neal & Dempsey

[57] ABSTRACT

Disclosed is a laser-imagable material comprising a transparent film having thereon a dried coating comprising graphite particles and binder. Also disclosed is the method of making the laser-imagable material and the method of imaging it.

18 Claims, No Drawings

COATED TRANSPARENT FILM FOR LASER IMAGING

CROSS REFERENCE TO OTHER RELATED APPLICATIONS

This application is a Continuation of my co-pending application for "Coated Transparent Film for Laser Imaging", filed Jan. 16, 1978, Ser. No. 869,913 now abandoned.

BACKGROUND OF THE INVENTION

1. Field of the Invention

This invention relates to the recording of information on film and particularly to the production of negative or positive film transparencies useful in the production of proof copies or for imaging printing plates.

2. Description of the Prior Art

Recently, many systems for imaging printing plates with laser beams have been proposed. U.S. Pat. No. 3,964,389 to John O. H. Peterson, which is herein incorporated by reference, discloses a method of making an imaged printing plate using a transparent substrate coated with (a) particles which absorb laser energy, (b) a self-oxidizing binder, and (c) a cross-linking agent or a cross-linking agent in combination with a cross-linkable resin. The coated side of the substrate is placed in intimate contact with a lithographic printing surface and subjected to a laser beam directed through the transparent substrate which by writing in the configuration of an image selectively transfers portions of the coating to the lithographic printing surface. The transferred coating is then rendered durable by heating the binder or resin to cross link it.

The transferred coating leaves a clear area on the transparent substrate which corresponds to the image areas on the lithographic printing surface. The laser-imaged transparent film thus constitutes a negative transparency of the image produced by the laser beam on the plate. Such a negative transparency is useful as a mask in the production of proof copies or for imaging conventional photo lithographic printing plates.

The Peterson patent discloses the use of carbon black particles in the coating to absorb laser energy. The Peterson coating can be transferred to the lithographic printing surface satisfactorily with acceptable laser power requirements, but more coating residue may be left behind on the transparent film than desirable for forming good negative masters. Increasing the power of the laser or slowing down the writing speed leaves less residue behind, but this is undesirable for obvious reasons.

SUMMARY OF THE INVENTION

In view of the shortcomings of the prior art, it is desirable, and is therefore an object of this invention, to provide a laser removable coating on a transparent film which can be completely removed where it is struck by the laser with less laser power and/or faster laser writing speed. These and other objects are provided by the present invention which is a transparent film having thereon a uniform, dried coating composition comprising graphite particles and binder. The binder is used in sufficient quantity to form a stable coating on the transparent film which will not rub off when subjected to the normal handling involved in imaging and using it as a mask. Preferably, the ratio of graphite particles to binder will be from about 10:1 to about 1:1. Surprisingly, the binder does not have to be a self-oxidizing binder as previously believed necessary. The invention can be used optionally to transfer the coating to a lithographic printing surface to also form a printing plate in the manner taught by the Peterson patent. If so, the binder may be a cross-linkable resin and the coating will also include a cross-linking agent, or an additional cross-linkable resin may be included in the coating.

The invention is also the method of making a laser-imagable material which comprises the steps of applying to a transparent film a uniform coating comprising graphite particles and binder dispersed in an organic diluent, and then drying the coating. Applying the coating in an organic diluent results in a coating which is more completely removable for the same laser power than one applied in an aqueous diluent. The preferred organic diluent is isopropanol alcohol, because it can be used in coating almost any transparent film, including the inexpensive polystyrene film, without dissolving the film.

The invention is also the method of making an imaged transparency, which method comprises the steps of providing a laser-imageable members which comprises a transparent film having thereon a uniform coating comprising graphite particles and binder and directing laser energy in an image pattern to the coating to selectively remove the portion of the coating to which the laser energy is directed, whereby the portion of the coating to which laser energy is directed is removed from the film more completely with less laser energy. The image pattern can be either positive or negative to produce either a positive or negative mask.

In the preferred form of the invention, the coated side of the transparent film is placed in intimate contact with a receptor sheet, and the portion of the coating removed from the film is transferred to the receptor sheet. The receptor sheet is useful for several reasons. It provides an instant positive proof when the laser-imageable member is imaged to form a negative transparency. It collects the blown-off coating and thereby prevents contamination of the laser-imaging equipment. And it improves clarity of the imaged areas of the transparency. The receptor sheet can be provided by, for example, paper, metal, or plastic, or if desired, it can be a lithographic printing surface useful in producing a printing plate such as that described in the Peterson patent. The preferred form of receptor sheet is a porous sheet such as paper, which is advantageous when used in a laser apparatus having a vacuum hold-down surface, because the suction is effective through the receptor sheet to pull the laser-imageable member into intimate contact with the receptor sheet. It also provides better transfer of coating to the receptor sheet by virtue of the suction applied through the sheet. The paper should be uncoated, but could be slightly coated as long as it remains porous.

DETAILED DESCRIPTION OF THE PREFERRED EMBODIMENTS

The following examples illustrate the advantages of the present invention.

EXAMPLE 1

A dispersion (Acheson Colloids Electrodag 154) consisting of 100 parts (by weight) of graphite particles (approximately 1 micron size), 30 parts (by weight) ethyl cellulose and 650 parts (by weight) of isopropanol alcohol was diluted with isopropanol to a desirable coating vicosity and uniformly coated with a mayer rod onto a three mil (0.003 inch) thick transparent Mylar polyester film to a thickness which provided a light transmission density of about 2.5 (approximately ½ pound coating per 3,300 ft². ream). The coating was dried to form a laser-imagable member of the present invention.

EXAMPLE 11

A dispersion (Inmont 9070) consisting of 11.8 parts (by weight) carbon furnace black particles (10–25 microns size) and 12.2 parts (by weight) ethyl cellulose in 15.0 parts (by weight) ethyl alcohol and 61.0 parts (by weight) toluene was further diluted with toluene to a desirable coating vicosity and uniformly coated with a mayer rod onto a Mylar polyester film as in Example 1 to a thickness which provided a light transmission density of about 2.5 (approximately 1.5 pounds coating per 3,300 ft². ream). The coating was then dried to form a laser-imagable member for comparison with the present invention.

Both examples of coated film were imaged from the uncoated side with a scanning YAG (yttrium-aluminum-garnet) laser apparatus which provided a 1 mil diameter spot laser beam at about 1.06 microns wave length. The coated side of the film was placed against a porous paper receptor and the two were placed in a holder 50 inches in circumference which was scanned at 80 revolutions per second. A vacuum applied through the holder held the paper and film. The laser imaging apparatus was focused through the transparent film to the interface between the coating and the film, and the apparatus was programmed to provide a continuous line of spots in a helix of 1 mil pitch.

The amount of power applied to the laser was varied in stages from 0 to 8.1 watts to determine the amount of coating removed for each power level. The coated film of Example 1 started showing visible coating removal at 3.1 watts, and provided practically complete removal and transfer to the receptor sheet at about 5 watts. In contrast, the coated film of Example 11 showed no noticeable coating removal at any of the power levels, including 8.1 watts. Thus, the coated film of the present invention provided a more satisfactory laser-imagable member with lower laser energy requirements than one using carbon black in the coating.

Although it is not completely understood why a coating having graphite is more efficiently removed by laser than one containing the conventionally used carbon black, it is believed to be due to the crystalline structure of graphite compared to the amorphous structure of carbon black. Furthermore, it should be noted that the binder employed in Example 1 is not self-oxidizing. It is not fully understood why non-self-oxidizing binders are useful for laser imaging in the invention, but it is believed that the graphite particles enable their use. Self-oxidizing binders, such as nitrocellulose, are also useful in the invention. Of course, any binder used must be compatible with the other components in the member.

The particle size of the graphite should be between about 0.5 and 3.0 microns, preferably on the order of 1 micron. To be most useful for a master, the coating should be thick enough to provide low light transmission density, but not so thick to require excessive laser energy to image the film. The light transmission density is preferably from about 1.5 to about 3.5.

What is claimed is:

1. A laser-imageable member comprising a transparent film having thereon a dried, uniform coating comprising graphite particles and (sufficient) a non-self-oxidizing binder (to form a stable coating.) in sufficient quantity to prevent removal of the coating under normal handling conditions.

2. The member according to claim 1, wherein the coating has a light transmission density of from about 1.5 to about 3.5.

3. The member according to claim 1, wherein the particle size of the graphite is from about 0.5 to about 3.0 microns.

4. The member according to claim 1 wherein the binder comprises ethyl cellulose. (is provided by a non-self-oxidizing binder.)

5. The member according to claim 1, wherein the ratio of graphite particles to binder is from about 10:1 to about 1:1.

6. Method of making a laser-(imagable) imageable member comprising the steps of (a) applying to a transparent film a uniform coating comprising graphite particles and (sufficient) a binder (to form a stable coating) comprising ethyl cellulose in sufficient quantity to prevent removal of the coating under normal handling conditions, said graphite and binder being dispersed in an organic diluent and (b) drying the coating.

7. Method according to claim 6, wherein the organic diluent is isopropanol.

8. Method according to claim 7, wherein the transparent substrate is polystyrene.

9. Method according to claim 6, wherein the coating is applied to a thickness which provides a light transmission density of from about 1.5 to about 3.5.

10. Method according to claim 6, wherein the particle size of the graphite is from about 0.5 to about 3.0 microns.

11. Method according to claim 6, wherein the ratio of graphite particles to binder is from about 10:1 to about 1:1.

12. Method of making an imaged transparency comprising the steps of:
(a) providing a laser-imageable member (which comprises) including a transparent film having thereon a dried uniform coating (comprising) of a liquid dispersion of graphite particles and a non-self-oxidizing binder in sufficient quantity to prevent removal of the coating under normal handling; and
(b) directing laser energy in an image pattern in the coating to selectively remove the portion of the coating to which the laser energy is directed.

13. Method according to claim 12, wherein the laser energy is directed through the transparent film.

14. Method according to claim 12 wherein the binder in the coating is ethyl cellulose.

15. Method according to claim 12 further including the steps of: placing the coating in intimate contact with a receptor sheet onto which the portion of the coating removed from the film is transferred during laser imaging and applying a vacuum to said receptor sheet to maintain uniform surface contact between said film and receptor sheet.

16. A laser imageable member in accordance with claim 1 wherein said transparent film is polystyrene film.

17. A laser imageable member in accordance with claim 1 wherein said transparent film is a polyester film.

18. Method of producing a printing plate comprising intimately contacting with a lithographic printing surface, the coated surface of a transparent film having a uniform coating of graphite particles and a non-self-oxidizing binder in sufficient quantity to prevent removal of the coating under normal handling conditions, and directing a laser beam image pattern through the transparent film for selectively transferring a portion of the coated surface corresponding to said image pattern from said film to said lithographic printing surface.

* * * * *

UNITED STATES PATENT AND TRADEMARK OFFICE
CERTIFICATE OF CORRECTION

PATENT NO. : 4,245,003

DATED : January 13, 1981

INVENTOR(S) : Raymond L. Oransky and David G. Savage

It is certified that error appears in the above-identified patent and that said Letters Patent is hereby corrected as shown below:

Claim 1, line 3, delete --- (sufficient.) ---; line 4, delete --- (to form a stable coating) --

Claim 4, lines 2-3, delete --- (is provided by a now self-oxidizing binder.) --

Claim 6, line 1, delete --- (imagable) ---; line 4, delete --- (sufficient) --- and --- (to form a stable coating) ---

Claim 12, lines 3-4, delete --- (which comprises) ---; line 5, delete --- (comprising) ---

Signed and Sealed this

Seventh Day of September 1982

[SEAL]

Attest:

GERALD J. MOSSINGHOFF

Attesting Officer   Commissioner of Patents and Trademarks